United States Patent
Kim et al.

(10) Patent No.: US 7,990,168 B2
(45) Date of Patent: Aug. 2, 2011

(54) PROBE CARD INCLUDING A SUB-PLATE WITH A MAIN SUPPORTER AND A SUB-SUPPORTER WITH THE SUB-SUPPORTER HAVING PROBE NEEDLES

(75) Inventors: Jong-hoon Kim, Hwaseong-si (KR); Hyun-ae Lee, Suwon-si (KR); Jin-ho So, Seongnam-si (KR); Kwang-soo Park, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/708,976

(22) Filed: Feb. 19, 2010

(65) Prior Publication Data
US 2010/0141289 A1    Jun. 10, 2010

Related U.S. Application Data (62) Division of application No. 11/959,881, filed on Dec. 19, 2007, now abandoned.

(30) Foreign Application Priority Data

Jan. 30, 2007  (KR) .................................. 2007-9498

(51) Int. Cl.
*G01R 31/00* (2006.01)
*G01R 1/067* (2006.01)

(52) U.S. Cl. .............................. 324/756.03; 324/755.07
(58) Field of Classification Search .............. 324/755.07
See application file for complete search history.

(56) References Cited

U.S. PATENT DOCUMENTS

| | | |
|---|---|---|
| 5,604,446 A | 2/1997 | Sano |
| 6,411,353 B1 | 6/2002 | Yarita et al. |
| 6,750,669 B2 | 6/2004 | Holcombe |
| 7,245,134 B2 * | 7/2007 | Granicher et al. ........ 324/754.07 |
| 7,420,380 B2 * | 9/2008 | Kasukabe et al. ........ 324/756.03 |

FOREIGN PATENT DOCUMENTS

| | | |
|---|---|---|
| JP | 7-94561 | 4/1995 |
| JP | 11-344509 | 12/1999 |
| JP | 2000-314748 | 11/2000 |
| WO | WO 2005003793 A1 * | 1/2005 |

* cited by examiner

*Primary Examiner* — Roberto Velez
(74) *Attorney, Agent, or Firm* — Stanzione & Kim, LLP (57) ABSTRACT

A probe card to connect a semiconductor device to test equipment includes a Printed Circuit Board (PCB) in which an electrical wiring pattern is formed, a first connector fixed on an upper surface of the PCB to connect the test equipment to the PCB, probe needles connected to electrode pads of the semiconductor device, and a Flexible PCB (FPCB) to connect the PCB to the probe needles. Accordingly, a signal transmission characteristic can be enhanced, test expenses can be reduced, and ground noise can be reduced.

11 Claims, 7 Drawing Sheets

PROBE CARD INCLUDING A SUB-PLATE WITH A MAIN SUPPORTER AND A SUB-SUPPORTER WITH THE SUB-SUPPORTER HAVING PROBE NEEDLES

CROSS-REFERENCE TO RELATED APPLICATIONS

This application is a divisional of prior application Ser. No. 11/959,881, filed Dec. 19, 2007, now abandoned in the U.S. Patent and Trademark Office, which claims priority from Korean Patent Application No. 2007-9498, filed on Jan. 30, 2007, the disclosures of which we incorporate by reference in their entirety.

BACKGROUND OF THE INVENTION

1. Field of the Invention

The present general inventive concept relates to test equipment to test a semiconductor device, and more particularly, to a probe card by which transmission can be performed at a high speed by improving a transmission characteristic of a signal transmitted from a test apparatus, thereby reducing manufacturing costs by manufacturing the probe card in a replacement type or a separation type.

2. Description of the Related Art

To fabricate a conventional semiconductor chip, a series of processes, such as an oxidation process, a diffusion process, an ion implantation process, a photo-etching process, and a metal process, which are all performed on a wafer, are required. Between the series of processes and a packaging process for packaging semiconductor chips fabricated on the wafer, a probing test process is performed to test whether each semiconductor chip has a normal electrical characteristic.

A probe card is mainly used as probing equipment to test a wafer on which semiconductor chips are fabricated. That is, by connecting probe tips equipped at one end of the probe card to electrode pads of each semiconductor chip, applying a predetermined electrical signal to the semiconductor chip, and receiving an electrical signal output from the semiconductor chip, a normal or abnormal state of each semiconductor chip implemented on a semiconductor substrate is tested.

Figure 1:
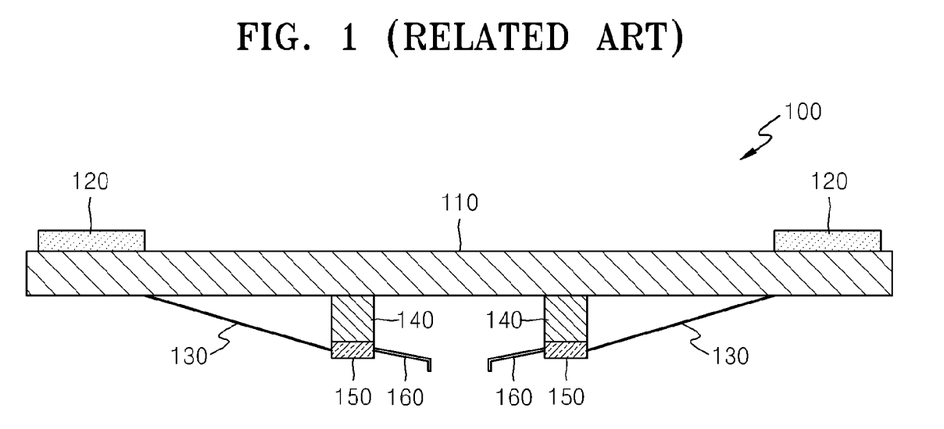
FIG. 1 is a cross-sectional diagram of a conventional probe card.

FIG. 1 is a cross-sectional diagram of a conventional probe card 100.

Referring to FIG. 1, the conventional probe card 100 includes a Printed Circuit Board (PCB) 110, a connector 120 assembled with the upper surface of the PCB 110 in order to be connected to test equipment (not illustrated), wires 130 electrically connected between the connector 120 and probe needles 160, needle supporters 140 for supporting the probe needles 160, epoxy resins 150 for preventing the movement of the wires 130 and the probe needles 160, and the probe needles 160 connected to electrode pads of a semiconductor chip.

The PCB 110 is formed in a disc shape and has an electrical wiring pattern therein. In the central portion of the PCB 110, a hole may be formed to expose a wafer. The connector 120 is a part used to connect test equipment, such as a T5592, which is a type of Auto Test Equipment (ATE), to the PCB 110, and may be a Zero Insertion Force (ZIF) socket or a pogo pin. The wires 130 are connected to the connector 120 via the electrical wiring pattern formed inside the PCB 110, and may be made of copper or a copper alloy.

The needle supporters 140 are members for supporting the probe needles 160 when the probe needles 160 are contact with electrode pads of a semiconductor chip, and may be made of ceramics. The epoxy resins 150 are used to attach the wires 130 to the probe needles 160 and prevent the movement of the probe needles 160 when a semiconductor chip is tested. The probe needles 160 are members contacted with electrode pads of a semiconductor chip and are formed to have sharp ends due to chemical etching. The probe needles 160 can be made of a material, such as tungsten, and may be bent at a predetermined angle.

The conventional probe card 100 transfers an electrical signal input from test equipment (not illustrated) to the probe needles 160 via the wires 130 when the conventional probe card 100 tests a semiconductor component, such as a memory or a controller. However, this method causes difficulty in testing at a high speed. For example, since a corner frequency (3 dB) is observed below 600 MHz, if an electrical signal is transmitted at a frequency of more than 1 GHz, a signal transmission characteristic is rapidly decreased at a connection part of the probe needles 160.

In addition, since the conventional probe card 100 has a structure in which the PCB 110 and the needle supports 140 are in one body, when semiconductor chips having different positions or numbers of pads are tested, it is inconvenient for the entire probe card 100 to require replacement. In addition, when the probe needles 160 become abnormal, it is difficult to replace or repair the probe needles 160. In particular, since the probe card 100 is expensive, when the probe card 100 is out of order or becomes abnormal, expenses required to replace or repair the probe card 100 become high.

SUMMARY OF THE INVENTION

The present general inventive concept provides a probe card capable of high-speed transmission by improving a transmission characteristic of a test signal when testing each semiconductor chip fabricated on a wafer using test equipment.

The present general inventive concept also provides a probe card, whereby costs required to manufacture the probe card can be reduced by forming the probe card in a separate type instead of a conventional monolithic type.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing a probe card to connect a semiconductor device to test equipment, the probe card including a main plate portion having a PCB in which an electrical wiring pattern is formed, a first connector fixed on an upper surface of the PCB to connect the test equipment to the PCB, probe needles connected to electrode pads of the semiconductor device, and a sub plate portion having a FPCB detachably attached to the main plate portion to connect the PCB to the probe needles.

The probe card may further include a second connector to connect the PCB and the FPCB, a main supporter, which can be connected to or disconnected from with a lower surface of the PCB, a sub-supporter fixed to a lower surface of the main supporter to support the probe needles, and an epoxy resin formed on the lower surface of the sub-supporter to fix the FPCB and the probe needles.

The second connector may include a 2-1 connector fixed on the lower surface of the PCB, and a 2-2 connector fixed to one end of the FPCB, wherein the 2-1 connector and the 2-2 connector can be connected when the main supporter is connected to the PCB.

A capacitor to prevent coupling generated between a power line and a ground line may be attached to the FPCB. In addition, the capacitor may be attached to the surface of the PCB or embedded using the epoxy resin.

A plurality of main supporters may be connected to or disconnected from a single PCB. In addition, the PCB may have a hole having a predetermined size in the center, and the FPCB may be connected to the PCB by passing through the hole.

The FPCB and the probe needles may be in contact during a soldering process. The main supporter and the PCB may be connected or disconnected using screws.

The FPCB may be formed with multiple layers, and the FPCB may be a Rigid Flexible (RF) type. The first connector may be a Zero Insertion Force (ZIF) socket.

The probe needles may be arranged in more than two rows, and the rows may be arranged with a predetermined angle. Each layer of the FPCB may contact a corresponding row of the probe needles during the soldering process.

The foregoing and/or other aspects and utilities of the present general inventive concept can also be achieved by providing a probe card to perform electrical characteristic tests on a semiconductor device, the probe card including a main plate portion having a PCB including electrical wiring, a sub plate portion having an FPCB detachably connectable to the main plate portion, and a plurality of probe needles connected at one end to the sub-plate portion and having another end at a semiconductor device to perform the electrical characteristic tests.

The main plate portion may include a first connector fixed on a surface of the PCB to detachably connect the PCB to the FPCB.

The sub plate portion may include a second connector to detachably connect the first connector of the PCB to the FPCB.

The second connector may be detachable from the FPCB.

The sub plate portion may include a first supporter to support the plurality of probe needles and the FCPB and to connect to the PCB.

The supporter may include at least one hole in which the FCPB can be inserted to reduce a length of the FCPB.

The sub plate portion may include a second supporter to house a capacitor and to connect to the FPCB and the plurality of probe needles.

The probe card may further include an epoxy resin to mold the capacitor to an inside portion of the second supporter.

The plurality of probe needles may be arranged in a plurality of rows, and the FPCB may include a plurality of layers to correspond to the plurality of rows.

The plurality of rows may be arranged at a predetermined angle.

The main plate portion may include a hole, and the plurality of probe needles may be connected to the PCB through the hole.

The sub plate portion may include a hole, and the plurality of probe needles may be connected to the PCB through the hole.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2A:
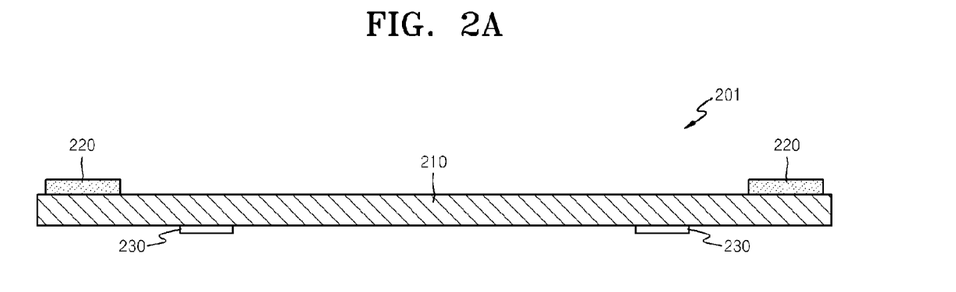
FIGS. 2A through 2C are cross-sectional diagrams of a probe card according to an embodiment of the present general inventive concept.
Figure 2B:
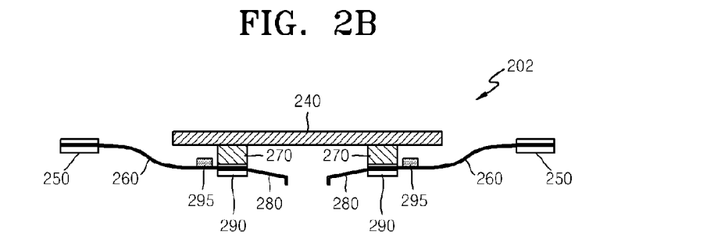
Figure 2C:
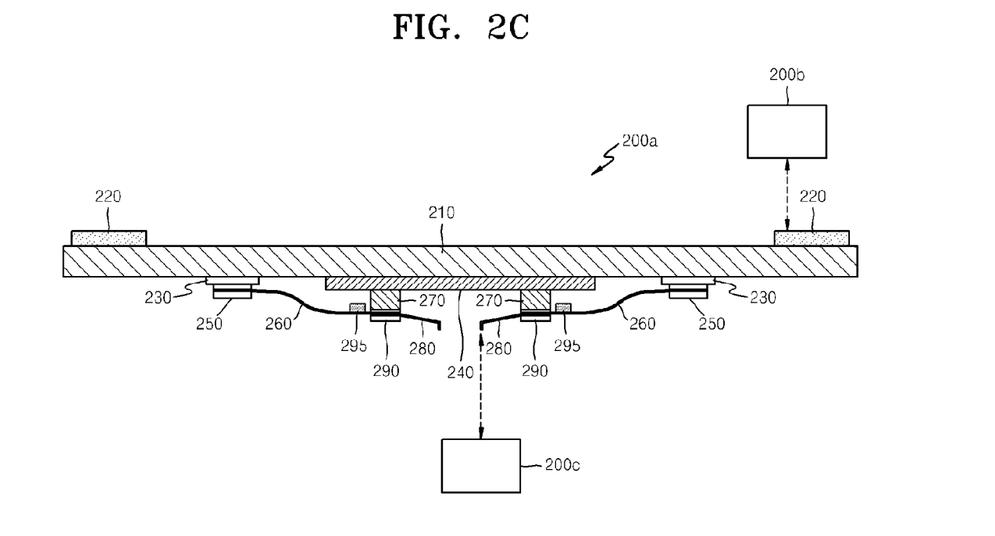

FIGS. 2A through 2C are cross-sectional diagrams of a probe card 200*a* according to an embodiment of the present general inventive concept.

FIG. 2A illustrates a Printed Circuit Board (PCB) used as a main plate and components assembled on the PCB, FIG. 2B illustrates a replaceable plate used as a sub-plate and components assembled an the replaceable plate, and FIG. 2C illustrates a configuration obtained by combining the configuration illustrated in FIG. 2A and the configuration illustrated in FIG. 2B.

Referring to FIG. 2A, the probe card 200*a* according to the current embodiment includes a PCB 210 used as a main plate, a Zero Insertion Force (ZIF) socket 220 assembled on an upper surface of the PCB 210, and a first Flexible PCB (FPCB) connector 230 assembled on a lower surface of the PCB 210. Here, the PCB 210, the ZIF socket 220, and the first PCPB connector 230 may constitute a main plate portion 201.

The PCB 210 is formed in a disc shape and has an electrical wiring pattern therein. In particular, the electrical wiring pattern forms a current path to transmit an electrical signal input from test equipment 200*b* via the ZIF socket 220 to the first FPCB connector 230. In the central portion of the PCB 210, a hole may be formed to observe a test operation when a semiconductor chip is tested.

The ZIF socket 220 is used as a connector to connect the test equipment to the PCB 210 and includes a lever to facilitate the connection. In particular, the test equipment can be easily assembled or disassembled using the lever. In addition, instead of the ZIF socket 220, a pogo pin or cable can be used.

The first FPCB connector 230 is a member to connect an FPCB 260 and the PCB 210. A ZIF socket or a pogo pin can be used as the first FPCB connector 230.

The PCB 210, the ZIF socket 220, and the first FPCB connector 230 can be commonly used in the probe card according to an embodiment of the present general inventive concept, regardless of positions or a number of electrode pads of a semiconductor chip 200*c* being tested.

Referring to FIG. 2B, the probe card according to the current embodiment further includes a first supporter 240, a second FPCB connector 250 connected to the first FPCB connector 230, the FPCB 260 to transfer an electrical signal input from test equipment (not illustrated), a second supporter 270 to fix probe needles 280, the probe needles 280 to contact with electrode pads of a semiconductor chip 200c, an epoxy resin 290 to prevent movement of the FPCB 260 and the probe needles 280, and capacitors 295 to prevent coupling between a power line and a ground line connected to the probe card.

The first supporter 240 can be connected to or disconnected from the PCB 210, and can be replaced according to a type or size of a semiconductor chip to be tested. The first supporter 240 can be made of a metal or an insulator.

The second FPCB connector 250 is connected to the first FPCB connector 230, which is connected to the PCB 210, and may be a ZIF socket or a pogo pin. The second FPCB connector 250 transfers an electrical signal input from the first FPCB connector 230 to the FPCB 260.

The FPCB 260 is a member to transfer an electrical signal input from the test equipment to the probe needles 280, and can be formed with multiple layers. The multiple layers can include a conductive layer and an insulation layer. The FPCB 260 has characteristics of strong heat resistance, durability, and conductivity. The FPCB 260 may be a Rigid Flexible (RF) type.

The second supporter 270 is connected to a lower surface of the first supporter 240 and allows the probe needles 280 to be stably in contact with electrode pads of a semiconductor chip during a test operation. The second supporter 270 can be made of ceramics.

The probe needles 280 are members in contact with electrode pads of a semiconductor chip, are bent at a predetermined angle, and are formed to have sharp ends due to chemical etching. Each of the probe needles 280 has a diameter of approximately 100 μm and is made of tungsten.

The epoxy resin 290 is used to prevent movement of the FPCB 260 and the probe needles 280 after the FPCB 260 and the probe needles 280 are connected during a soldering process. The epoxy resin 290 is formed by a spreading process, a heating process, and a hardening process.

Each of the capacitors 295 is used to prevent ground noise by preventing coupling between the power line and the ground line connected to the probe card. The capacitors 295 can be attached to a surface of the FPCB 260 or can be embedded in the epoxy resin 290. Here, components illustrated in FIG. 2B may constitute a sub-plate portion 202 to be connected to the main plate portion 201 at corresponding positions.

Referring to FIG. 2C, the probe card 200a according to the current embodiment is formed by combining the main plate portion 201 and the sub-plate portion 202. That is, an electrical characteristic of a semiconductor chip 200c is tested using the probe card 200a formed by combining the PCB 210 and the first supporter 240 using screws or connectors.

Besides screws, clips or bolts and/or nuts can be used to connect the PCB 210 to the first supporter 240. In addition, by attaching a plurality of first supporters 240 to a single PCB 210, a plurality of semiconductor chips can be tested. According to sizes, spacing, and a number of semiconductor chips, a length of each FPCB 260, a position of each second supporter 270, and a number of probe needles 280 can be changed.

Compared to the relatively expensive PCB 210, the first supporter 240, which is a sub-plate, and the second FPCB connector 250, the FPCB 260, the second supporter 270, the probe needles 280, the epoxy resin 290, and the capacitors 295 connected to the first supporter 240 are all cheaper components, and thus, test expenses can be reduced by replacing the first supporter 240, which is a replaceable sub-plate, and/or any component connected to the first supporter 240 according to a type of a Device Under Test (DUT) to be tested. For example, the sub-plate portion 202 may have a first sub-plate portion and a second sub-plate portion which are connectable to the main plate portion 201. Here, the first sub-plate portion can be replaced by the second sub-plate portion.

Figure 3A:
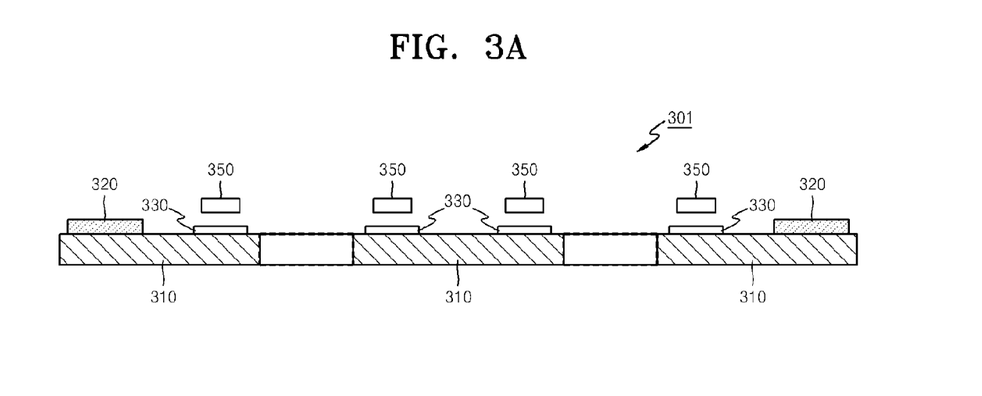
FIGS. 3A through 3C are cross-sectional diagrams of a probe card according to another embodiment of the present general inventive concept.
Figure 3B:
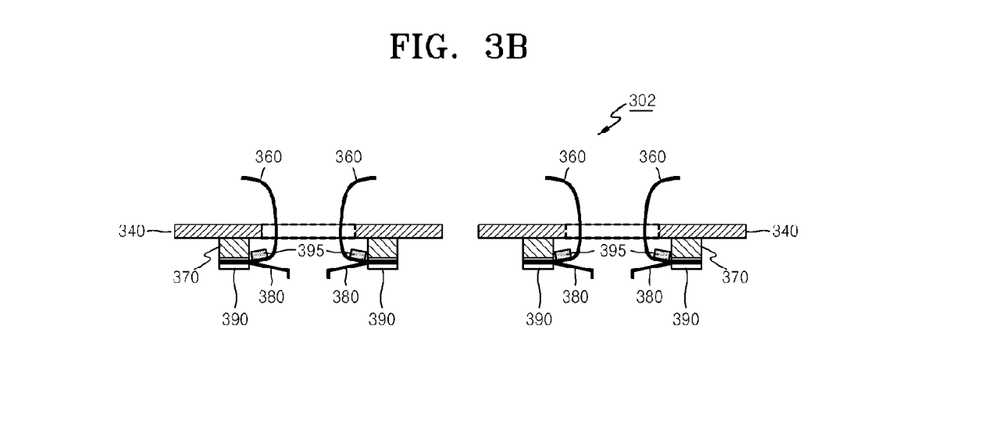
Figure 3C:
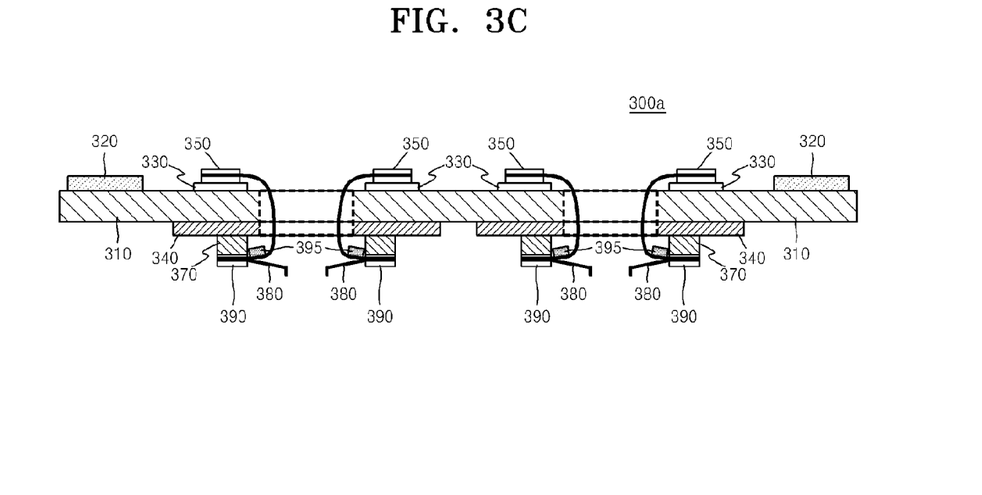

FIGS. 3A through 3C are cross-sectional diagrams of a probe card 300a according to another embodiment of the present general inventive concept.

FIG. 3A illustrates a PCB used as a main plate and components connected to the PCB, FIG. 3B illustrates a replaceable plate used as a sub-plate and components connected to the replaceable plate, and FIG. 3C illustrates a configuration of the probe card 300a obtained by combining the configuration of a main plate portion 301 illustrated in FIG. 3A and the configuration of a sub-plate portion 302 illustrated in FIG. 3B.

Referring to FIG. 3A, the probe card according to the current embodiment includes a PCB 310 used as a main plate, a ZIF socket 320 connected to the upper surface of the PCB 310, and first FPCB connectors 330 connected to the upper surface of the PCB 310.

Unlike the probe card illustrated in FIG. 2A, the PCB 310 has holes 310a with predetermined sizes, and the first FPCB connectors 330 are assembled on an upper surface of the PCB 310.

The PCB 310 can have one or more holes 310a having a predetermined size. Each hole is a portion through which a plurality of FPCBs 360, which each contact probe needles 380, respectively, pass and allow a length of each FPCB 360 to be reduced. A number of holes 340a corresponds to a number of first supporter 340, and a test process of a semiconductor chip to be tested can be observed through each hole. Each hole can be formed in a disc shape.

The first FPCB connectors 330 can be connected to an upper surface of the PCB 310. As described above, each first FPCB connector 330 can use a ZIF socket or a pogo pin. If the first FPCB connectors 330 are connected to the upper surface of the PCB 310, second FPCB connectors 350 connected to ends of the FPCBs 360 can be formed on the first FPCB connectors 330.

Referring to FIG. 3B, the probe card according to the current embodiment further includes the first supporters 340, the second FPCB connectors 350 connected to the first FPCB connectors 330, the FPCBs 360 to transfer an electrical signal input from test equipment (not illustrates), second supporters 370 to fix probe needles 380, the probe needles 380 in contact with electrode pads of a semiconductor chip, epoxy resins 390 to prevent movement of the FPCBs 360 and the probe needles 380, and capacitors 395 to prevent coupling between a power line and a ground.

Unlike the probe card illustrated in FIG. 2B, a plurality of first supporters 340 can be connected to or disconnected from a lower surface of the PCB 310, and a hole exists in a center portion of each first supporter 340.

The hole is a portion of the first supporter 340 through which each FPCB 360 in contact with the probe needles 380 passes, and allows a length of each FPCB 360 to be reduced. A test process of a semiconductor chip to be tested can be observed through each hole. Each hole can be formed in a disc shape.

Since the FPCB 360, the second supporter 370, the probe needles 380, the epoxy resin 390, and the capacitors 395 are connected to each first supporter 340, if a number of first supporters 340 increases, numbers of the FPCB 360, the second supporter 370, the probe needles 380, the epoxy resin 390, and the capacitors 395 increase proportionally. The second FPCB connector 350 may not be connected to each first supporter 340.

Referring to FIG. 3C, the probe card according to the current embodiment is formed by combining the PCB 310, which is a main plate, and the first supporters 340, each being a sub-plate. That is, an electrical characteristic of a semiconductor chip is tested using the probe card formed by combining the PCB 310 and each first supporter 340 using screws.

Unlike the probe card illustrated in FIG. 2C, the PCB 310 has holes with predetermined sizes, each first FPCB connector 330 is connected to the upper surface of the PCB 310, a plurality of first supporters 340 can be connected to or disconnected from the lower surface of the PCB 310, and a hole exists in the center of each first supporter 340.

Thus, a number of semiconductor chips which can be tested simultaneously can be increased, and a length of each FPCB 360 can be reduced, resulting in improvement of a signal transmission characteristic.

Figure 4A:
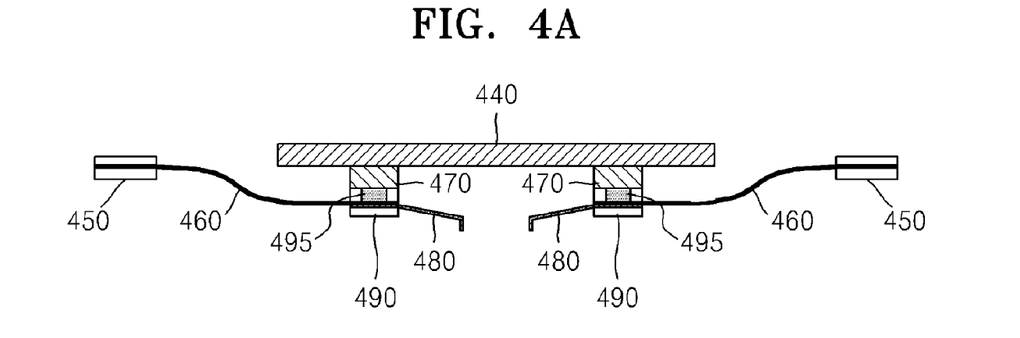
FIGS. 4A through 4B are cross-sectional diagrams of a probe card according to another embodiment of the present general inventive concept.
Figure 4B:
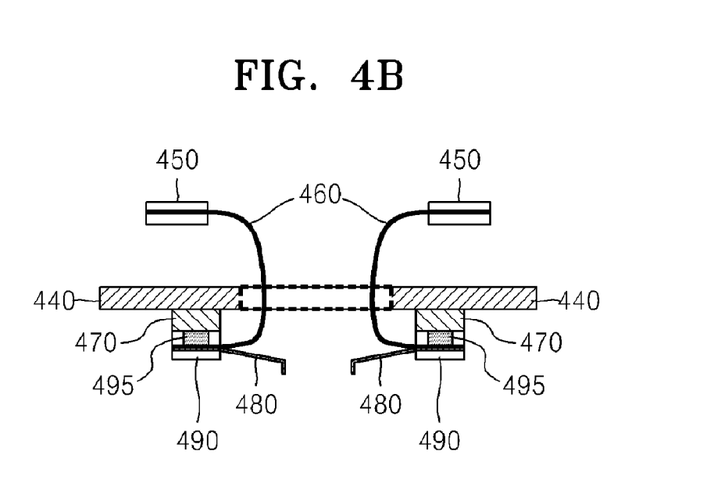

FIGS. 4A through 4B are cross-sectional diagrams of a probe card according to another embodiment of the present general inventive concept.

FIG. 4A illustrates a plurality of capacitors 495 attached to a FPCB 460 molded in a second supporter 470, and FIG. 4B illustrates that the capacitors 495 attached to the FPCB 460 are molded in the second supporter 470 and a hole is formed in a first supporter 440.

Referring to FIG. 4A, the probe card according to the current embodiment includes the first supporter 440, a second FPCB connector 450, a FPCB 460, the second supporter 470, probe needles 480, an epoxy resin 490, and the capacitors 495. Each capacitor 495 is used to reduce coupling between a power line and a ground line, and is molded, i.e., embedded, in the second supporter 470 using the epoxy resin 490. Thus, ground noise can be reduced more than when the capacitors 495 are exposed.

Referring to FIG. 4B, the probe card according to the current embodiment includes the first supporter 440, the second FPCB connector 450, the FPCB 460, the second supporter 470, the probe needles 480, the epoxy resin 490, and the capacitors 495. Each capacitor 495 is molded in the second supporter 470 using the epoxy resin 490, and the FPCB 460 is connected to the PCB 410 through the hole formed in a center portion of the first supporter 440. Thus, ground noise can be much more reduced, and a length of the FPCB 460 can be reduced, resulting in improvement of a signal transmission characteristic.

Figure 5:
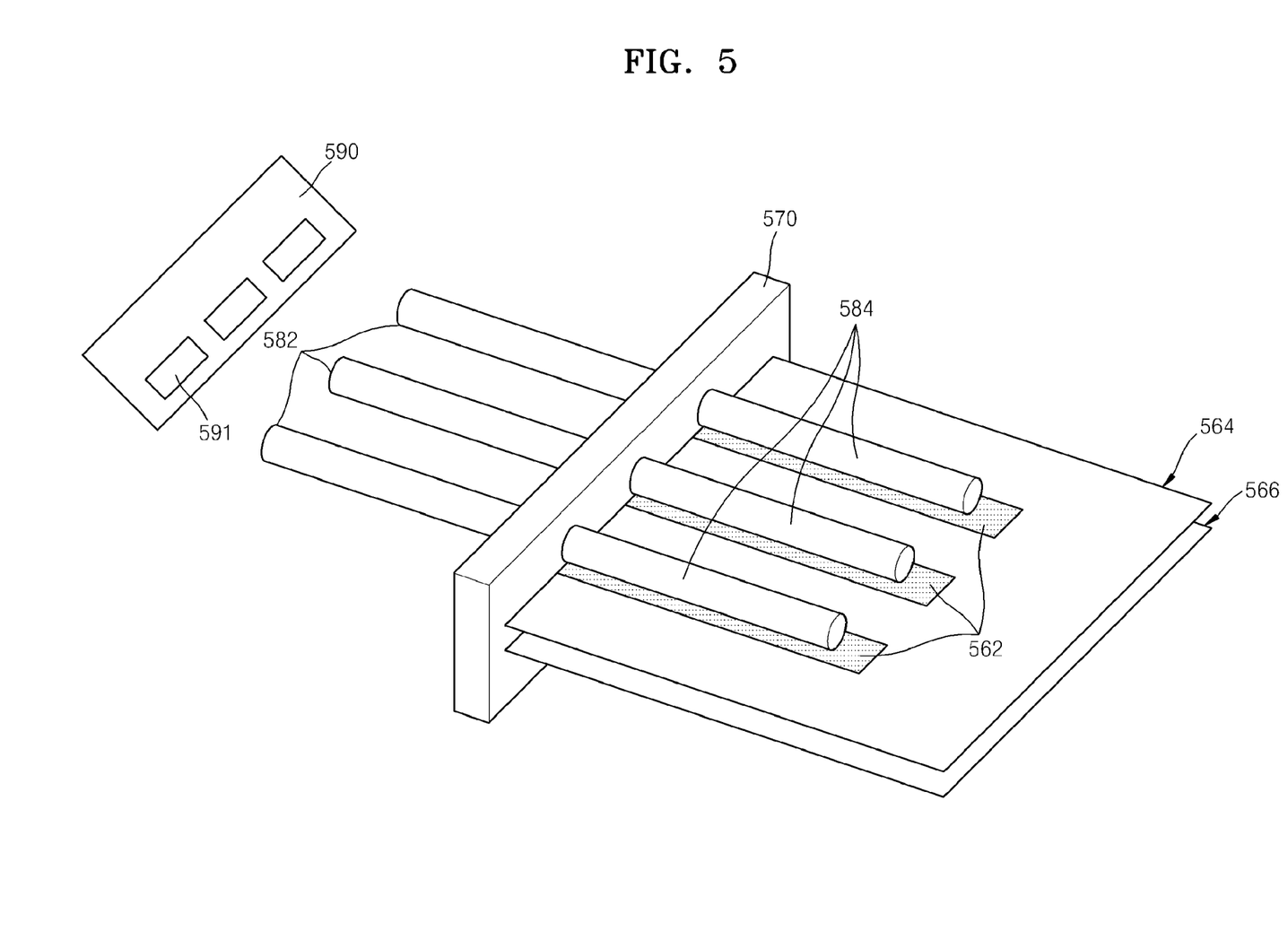
FIG. 5 is a perspective view of probe needles according to an embodiment of the present general inventive concept.

FIG. 5 is a perspective view of probe needles according to an embodiment of the present general inventive concept.

Referring to FIG. 5, a plurality of probe needles can be configured. A first portion 582 of the probe needles is exposed to an outside thereof, and a second portion 584 of the probe needles is molded in a second supporter 570. Probe tips are formed at first ends of the first portion 582 of the probe needles, and contact electrode pads 591 of a semiconductor chip 590.

A flexible printed circuit board (FPCB) can be formed with a first layer 564 and a second layer 566, wherein the first layer 564 and the second layer 566 are made of a conductive material, and a dielectric material is occupied between the first layer 564 and the second layer 566. When a signal is transmitted, the second layer 566 becomes a reference layer of the first layer 564.

The second portion 584 of the probe needles contacts a contact surface 562 of the first layer 564 of the FPCB, the second portion 584 of the probe needles is connected to the contact surface 562 of the first layer 564 of the FPCB during the soldering process, and the connected portion is covered with epoxy resins (not illustrated) during a molding process. The second portion 584 of the probe needles is connected to the PCB (210 or 310) through the first FPCB connector (230 or 330) and the FPCB 564 or 566.

Figure 6A:
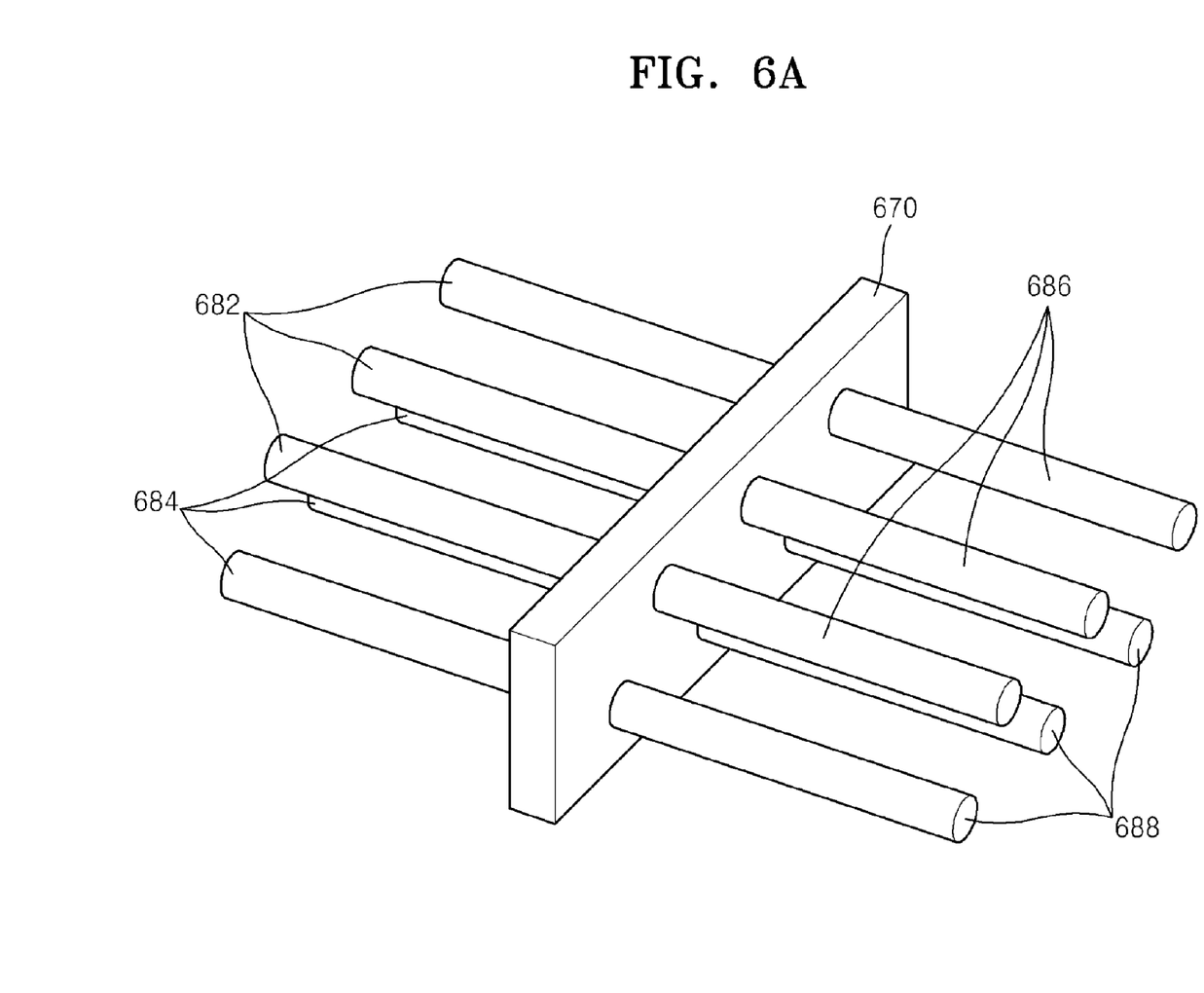
FIGS. 6A through 6B are perspective views of probe needles according to another embodiment of the present general inventive concept.
Figure 6B:
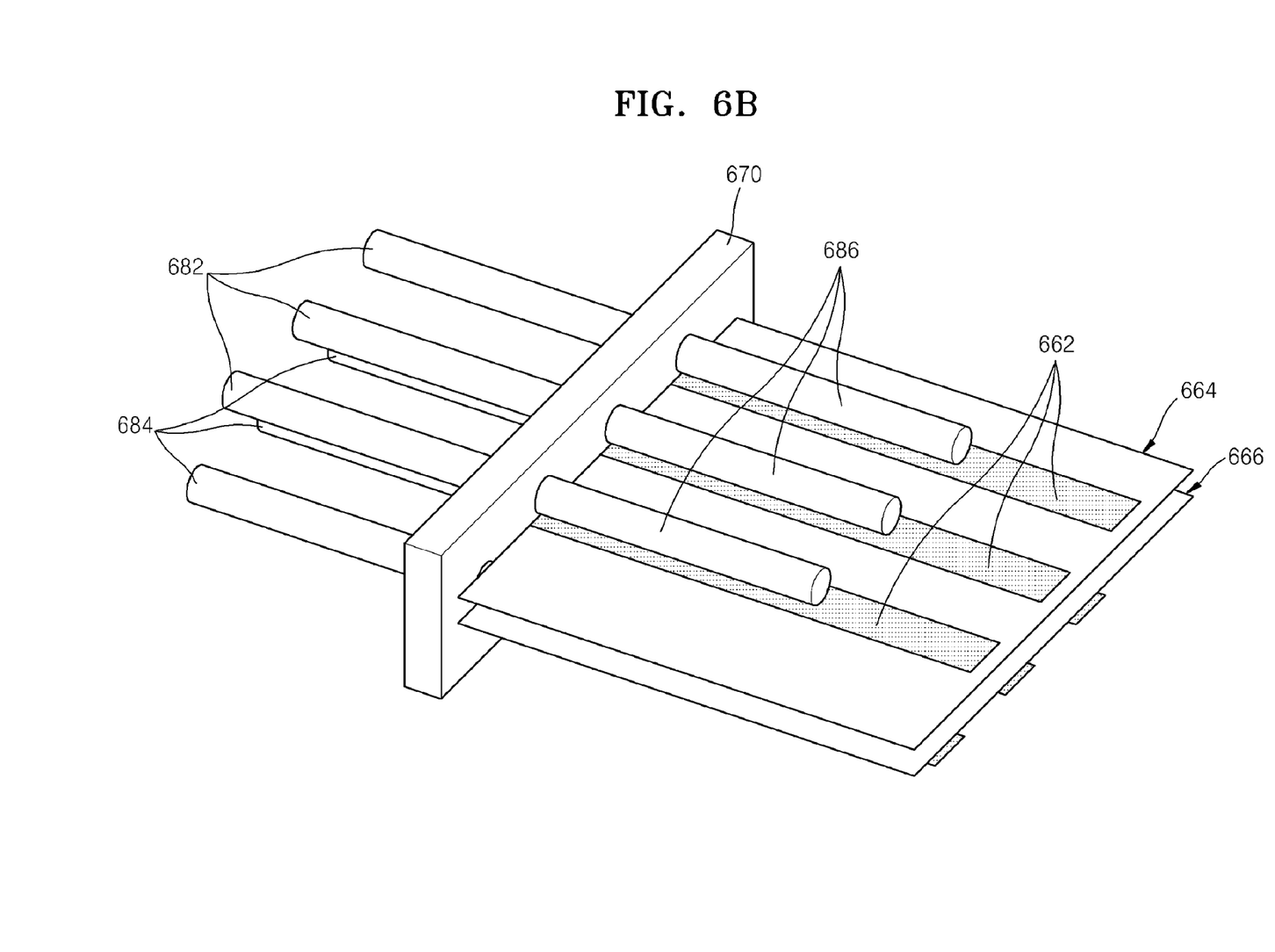

FIGS. 6A through 6B are perspective views of probe needles according to another embodiment of the present general inventive concept.

FIG. 6A illustrates a plurality of probe needles, and FIG. 6B illustrates a portion in which the plurality of probe needles contact an FPCB.

Referring to FIG. 6A, the probe needles are configured with a plurality of rows, each row being arranged at a predetermined angle. First portions 682 and 684 of the probe needles are exposed to the outside, and second portions 686 and 688 of the probe needles are molded to a second supporter 670. The predetermined angle may be 0° or 45°.

Referring to FIG. 6B, a first row 686 of the second portions 686 and 688 of the probe needles contacts a contact surface 662 of a first layer 664 of the FPCB, and a second row 688 of the second 686 and 688 of the probe needles contacts a contact surface (not illustrated) of a second layer 666 of the FPCB. That is, the rows 686 and 688 of the probe needles contact the first layer 664 and the second layer 666, respectively, during the soldering process.

As described above, according to the present general inventive concept, since a probe card uses a FPCB, a signal transmission characteristic can be enhanced, and since a replaceable sub-plate is used, test expenses can be reduced. Furthermore, since capacitors to prevent coupling between a power line and a ground line are included, ground noise can be reduced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A probe card to connect a semiconductor device to test equipment, the probe card comprising:
   a main plate portion having a PCB (Printed Circuit Board) including an electrical wiring pattern;
   a first connector fixed on an upper surface of the PCB to connect the test equipment to the PCB;
   a second connector to connect the PCB to a FPCB (Flexible Printed Circuit Board);
   a plurality of probe needles connected to electrode pads of the semiconductor device; and
   a sub-plate portion having the FPCB detachably attached to the main plate portion to connect the PCB and the plurality of probe needles, the sub-plate including:
      a main supporter to be connected to or disconnected from a lower surface of the PCB;
      a sub-supporter fixed to a lower surface of the main supporter to support the probe needles; and
      an epoxy resin formed on a lower surface of the sub-supporter to fix the FPCB and the plurality of probe needles,
   wherein the PCB includes a hole having a predetermined size in a center portion thereof and the FPCB is connected to the PCB by passing through the hole.

2. The probe card of claim 1, wherein the sub-plate further comprises:
   a capacitor attached to the FPCB to prevent coupling generated between a power line and a ground one.

3. The probe card of claim 1, wherein the FPCB and the plurality of probe needles are connected during a soldering process.

4. The probe card of claim 1, wherein the main supporter and the PCB are connected or disconnected using screws.

5. The probe card of claim 1, wherein the FPCB is formed with multiple layers.

6. The probe card of claim 1, wherein the FPCB is a Rigid Flexible (RF) printed circuit board.

7. The probe card of claim 1, wherein the first connector is a Zero Insertion Force (ZIF) socket.

8. A probe card to perform electrical characteristic tests on a semiconductor device, the probe card comprising:
   a main plate portion having a PCB (Printed Circuit Board) including electrical wiring;
   a sub-plate portion having an FPCB (Flexible Printed Circuit Board) detachably connectable to the main plate portion, the sub-plate including:
      a main supporter to be connected to or disconnected from a lower surface of the PCB;
      a sub-supporter fixed to a lower surface of the main supporter to support a plurality of probe needles; and
      an epoxy resin formed on a lower surface of the sub-supporter to fix the FPCB and the plurality of probe needles; and
   the plurality of probe needles are connected at one end to the sub-plate portion and have another end at a semiconductor device to perform the electrical characteristic tests,
   wherein the PCB includes a hole having a predetermined size in a center portion thereof and the FPCB is connected to the PCB by passing through the hole.

9. The probe card of claim 8, wherein the main plate portion comprises:
   a first connector fixed on a surface of the PCB to detachably connect the PCB to the FPCB.

10. The probe card of claim 9, wherein the sub plate portion comprises:
   a second connector to detachably connect the first connector of the PCB to the FPCB.

11. The probe card of claim 8, wherein the sub plate portion comprises:
   a first supporter to support the plurality of probe needles and the FCPB and to connect to the PCB.

* * * * *